US009397823B2

(12) United States Patent
Zerbe et al.

(10) Patent No.: US 9,397,823 B2
(45) Date of Patent: *Jul. 19, 2016

(54) METHODS AND CIRCUITS FOR REDUCING CLOCK JITTER (71) Applicant: Rambus Inc., Sunnyvale, CA (US)

(72) Inventors: Jared Zerbe, Woodside, CA (US); Teva Stone, Chapel Hill, NC (US); Jihong Ren, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/518,061

(22) Filed: Oct. 20, 2014

(65) Prior Publication Data

US 2015/0036775 A1 Feb. 5, 2015

Related U.S. Application Data (63) Continuation of application No. 13/878,351, filed as application No. PCT/US2011/054615 on Oct. 3, 2011, now Pat. No. 8,890,580.

(60) Provisional application No. 61/391,918, filed on Oct. 11, 2010.

(51) Int. Cl.
*H04L 7/02* (2006.01)
*H03K 5/1252* (2006.01)
*H03L 7/00* (2006.01)

(52) U.S. Cl.
CPC .............. *H04L 7/02* (2013.01); *H03K 5/1252* (2013.01); *H03L 7/00* (2013.01)

(58) Field of Classification Search
CPC ............. H04L 25/03057; H04L 25/0212; H04L 25/0272; H04L 1/0003; H04L 25/03; H04L 27/34; H04L 7/0037; H04L 7/0041; H04L 7/0058
USPC ................... 327/201, 202, 203; 375/233, 360
See application file for complete search history.

(56) References Cited

U.S. PATENT DOCUMENTS

| | | | |
|---|---|---|---|
| 6,791,428 B2 | 9/2004 | Senthilkumar et al. | |
| 7,397,712 B2 | 7/2008 | Choi et al. | |
| 7,496,138 B2 | 2/2009 | Pietraski et al. | |
| 8,890,580 B2 * | 11/2014 | Zerbe | H03K 5/1252 327/108 |
| 2003/0223519 A1 | 12/2003 | Jeong et al. | |
| 2005/0195894 A1 * | 9/2005 | Kim | H04L 25/03019 375/232 |
| 2008/0056344 A1 | 3/2008 | Hidaka | |
| 2008/0191774 A1 | 8/2008 | Lytollis | |
| 2008/0285684 A1 | 11/2008 | Shen et al. | |

(Continued)

OTHER PUBLICATIONS

Chaudhuri et al., "Jitter Amplification Characterization of Passive Clock Channels at 6.4 and 9.6 Gb/s," 2006 IEEE Electrical Performance of Electronic Packaging, pp. 21-24. 4 pages.

(Continued)

*Primary Examiner* — John Poos
(74) *Attorney, Agent, or Firm* — Silicon Edge Law Group LLP; Arthur J. Behiel (57) ABSTRACT

A communication system includes a continuous-time linear equalizer in the clock forward path. The equalizer may be adjusted to minimize clock jitter, including jitter associated with the first few clock edges after the clock signal is enabled. Reducing early-edge jitter reduces the power and circuit complexity otherwise needed to turn the system on quickly.

16 Claims, 8 Drawing Sheets

(56) References Cited

U.S. PATENT DOCUMENTS

| | | | |
|---|---|---|---|
| 2009/0154542 A1 | 6/2009 | Ding et al. | |
| 2009/0316770 A1 | 12/2009 | Hidaka | |
| 2010/0027712 A1 | 2/2010 | Poulton | |
| 2010/0284686 A1* | 11/2010 | Zhong | H04L 25/03019 398/1 |

OTHER PUBLICATIONS

Figueiredo et al., "Noise and Jitter in CMOS Digitally Controlled Delay Lines," Universidade de Aveiro, Dpt. Electronica e Telecomunicacoes, 2006, IEEE, pp. 1356-1359. 4 pages.

Gao et al., "A 10Gb/s wire-line transceiver with half rate period calibration CDR," 2009 IEEE International Symposium on Circuits and Systems, ISCAS 2009, pp. 1827-1830, May 24-27, 2009. 4 pages.

Gupta, Sanjeev, "Continuous-Time Equalizers Improve High-Speed Serial Links," Agilent Technologies EESOF Division, Apr. 8, 2010, pp. 40-43. 4 pages.

Heydari et al., "Design of Ultra High-Speed CMOS CML buffers and Latches," Department of Electrical and Computer Engineering, University of California Irvine, 2004 IEEE. 4 pages.

International Preliminary Report on Patentability (Chapter I) dated Jul. 4, 2013 in International Application No. PCT/US2011/054615. 7 pages.

International Search Report and Written Opinion dated May 15, 2013 in International Application No. PCT/US2011/054615. 11 pages.

Kim et al., "A Continuous-Time Equalizer Adopting a Clock Attenuation Tracking Technique for Digital Display Interface (DDI)," IEICE Electronics Express, vol. 4, No. 21, published Nov. 10, 2007, pp. 638-643. 6 pages.

Luo et al., "Low Power Network Processor Design Using Clock Gating," University of California Riverside, Jun. 13-17, 2005. 4 pages.

Madden et al., "Jitter Amplification Considerations for PCB Clock Channel Design," Rambus Inc., 2007 IEEE. 4 pages.

\* cited by examiner

METHODS AND CIRCUITS FOR REDUCING CLOCK JITTER

FIELD

Embodiments of the invention relate to the distribution of timing signals (e.g. clock and strobe signals) for synchronizing sequential logic within and between integrated circuits.

BACKGROUND

High-speed digital communication typically requires transmitters and receivers to be synchronized. Such synchronization can be accomplished using a shared clock signal, or the receiver can derive a clock signal from received data. In either case, the clock signal oscillates between high and low states to create carefully timed signal edges that are used to coordinate the transmitter and receiver.

It is not necessary to coordinate the transmitter and receiver when no information is being conveyed between them, and clock signals consume considerable power. Clock circuitry is therefore disabled, or placed in an "idle" state, when not in use. Clock signals require time to stabilize after transitioning from the idle state. Circuits that rely on clock signals in such systems are therefore designed to ignore early clock edges until the clock signal has had an opportunity to stabilize. In high-speed, low-power systems this wait time has an unacceptable impact on performance and system complexity.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
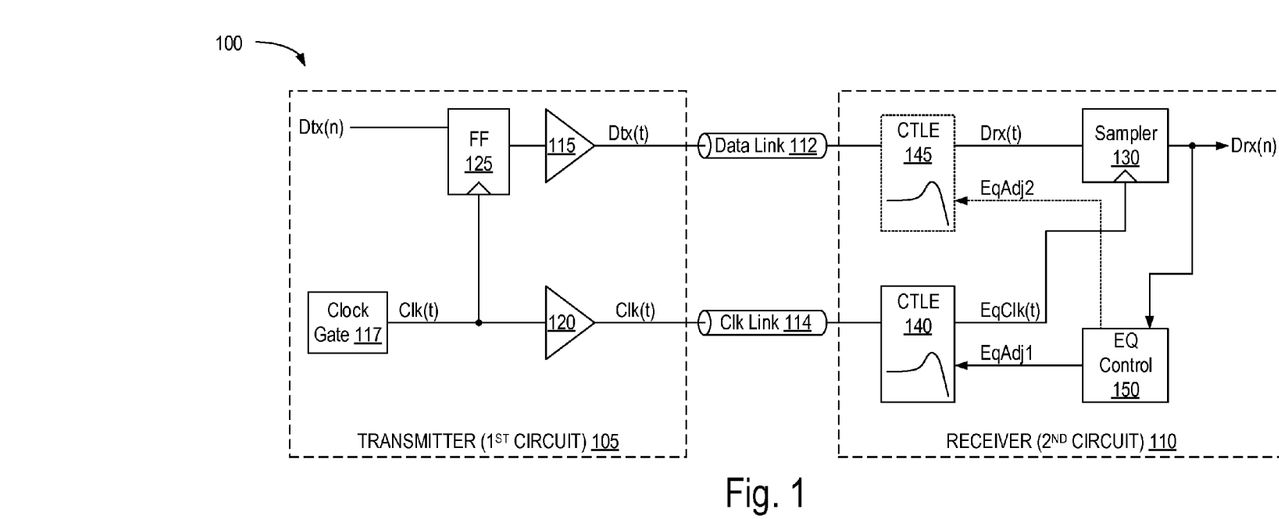
FIG. 1 depicts a source-synchronous communication system 100 in accordance with one embodiment.

FIG. 1 depicts a source-synchronous communication system 100 in accordance with one embodiment. Clock signals distributed within system 100 for synchronization are equalized to reduce inter-symbol interference (ISI) that distorts early clock edges, and therefore to reduce or eliminate the wait time otherwise required to settle on a stable clock signal. System 100 can therefore transition quickly between idle and active states. As detailed below, system 100 uses a combination of elements to achieve the benefits of a high-bandwidth clock path without the attendant disadvantages.

System 100 includes first and second integrated circuits (ICs) 105 and 110, respectively a transmitter and a receiver, interconnected via a data link 112 and clock link 114. Transmitter 105 includes a data buffer 115, a clock gate 117, a clock buffer 120, and a sequential storage element 125 (a flip-flop) that times a data signal Dtx(n) to a clock signal Clk(t) when clock gate 117 enables the clock. In some embodiments, clock buffer 120 is a CML buffer that operates at low signal voltages relative to CMOS buffers.

Though depicted using single lines, data link 112 and clock link 114 can be differential, and buffers 115 and 120 can be implemented using current-mode logic (CML), which is a differential signaling scheme that employs low voltage swings to achieve relatively high signaling speeds and linear amplification. CML is sometimes referred to as source-coupled logic, or SCL. Voltage-mode signaling can also be used.

Receiver 110 includes a sampler 130, a continuous-time linear equalizer (CTLE) 140 in the clock path between gate 117 and sampler 130, and an optional second CTLE 145 in the data path that can be included to match received data signal Drx(t) to equalized clock signal EqClk(t). In this context, a "continuous-time" signal is one that is continuous in time, and a "continuous-time" equalizer is one that is also continuous in time, e.g. it does not use any clocking for signal decimation and operates over a range of frequencies. Receiver 110 additionally includes control circuitry 150 that can derive error information from data Drx(n) from sampler 130 and, based on this feedback, control an equalization adjustment signal EqAdj1 to adjust equalizer 140. Control circuitry 150 therefore provides equalization feedback that can be used to minimize signaling errors. The error information control circuitry 150 derives from data signal Drx(n) can be specific to the initial clock periods or periods following an idle period, or can be more general error information. The same or a separate equalization control signal EqAdj2 can be provided for the optional data equalizer 145.

In other embodiments errors can be detected and control signals developed using circuitry external to receiver 110. Methods of detecting receive errors are well known, so a detailed discussion is omitted for brevity.

Sampler 130 samples data signals Drx(t) from data link 112 on edges of a clock signal EqClk(t) from CTLE 145. Signal EqClk(t) is an equalized version of clock signal Clk(t) from transmitter 105 that arrives via clock link 114. Clock gate 117 can gate an externally provided clock signal (not shown), or can develop a clock signal internally. Different clock sources are used to provide clock signals to equalized clock paths in other embodiments. Likewise, clock destinations other than flip-flops and samplers might also benefit from equalized clock signals. Clock sources, destinations, and circuits for clock switching are well known, so detailed discussions of these elements are omitted for brevity.

Clock paths can be characterized as having relatively low or high bandwidth. In this context, bandwidth refers to the ability of a clock path to reproduce a sine wave over a range of frequencies. Low-bandwidth clock paths use little power, but can be difficult to turn on and off quickly without increased phase error, or "jitter." Jitter can be reduced by increasing the power, and thus the bandwidth, but increasing power is undesirable for low-power systems. Power usage is particularly troublesome for mobile computing devices because the desired levels of processing power are incompatible with small, inexpensive batteries. The clock paths of system 100 are of the low-bandwidth variety, and consequently can have high jitter when turning the clock signal on or off. Equalizing the clock path in the manner of system 100 reduces the jitter of the first clock edges to allow them to act as effective timing references.

Figure 2:
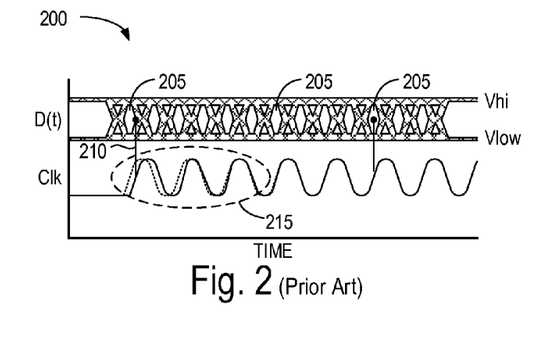
FIG. 2 (prior art) is a waveform diagram 200 illustrating how distortion of early clock-signal edges can lead to data errors.

FIG. 2 (prior art) is a waveform diagram 200 illustrating how distortion of early clock-signal edges can lead to data errors. Data D(t) is represented as an eye diagram in which each opening 205 represents a two-dimensional time/voltage space within which valid data can be sampled. Referring to clock edge 210, sampling data D(t) at a voltage equidistant between the high and low data voltages Vhi and Vlow and centered within the respective eye results in a correct data sample. Sampling data D(t) in the shaded regions surrounding openings 205 is likely to produce a sample error.

The edges within the first three sets of clock edges 215 are timed differently than the latter clock edges with respect to data signal D(t). The first edge, for example, rises considerably later than it would if it followed the same timing as the latter edges, as identified using dashed lines. The resulting relatively early sample instant can introduce a sample error, and is therefore undesirable.

The signal distortion within the early edges is due, at least in part, to a phenomenon commonly referred to as "intersymbol interference" (ISI), which is manifested in the temporal spreading and consequent overlapping of neighboring pulses. Surprisingly, edges 215 suffer less ISI than do the latter edges. The ISI experienced by the early edges is imbalanced with respect that experienced by the later edges, however, because there are fewer preceding edges and succeeding edges. For example, the first edge has no recent preceding edge and a large number of succeeding edges, so all the ISI is due to succeeding edges. In contrast, each of the latter edges experiences the same ISI as its neighbors, so the edges tend to experience minimal jitter when compared to each other. Though not shown, disabling clock signal Clk would reduce the number of succeeding edges for the last edges, and consequently introduce imbalanced ISI that would also move the clock edges away from the ideal.

Returning to FIG. 1, the recognition that the clock edges were suffering different levels of ISI lead to the inclusion of CTLE 140 to reduce this type of distortion, which in turn allows system 100 to transition more quickly between idle and active states. CTLE 140 alters the relative amplitudes of different frequency components of clock signal Clk(t), and in doing so reduces the degree to which the early edges are offset relative to the later edges.

Figure 3:
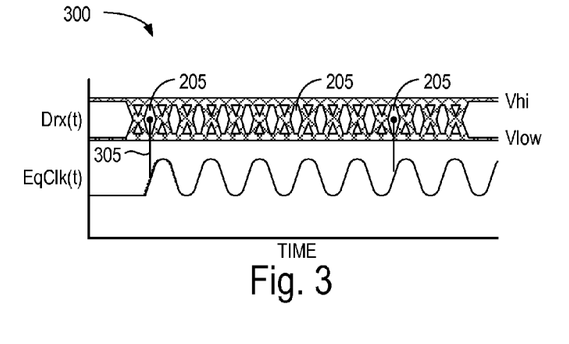
FIG. 3 is a waveform diagram 300 illustrating how distortion of early clock-signal edges is reduced relative to later edges.

FIG. 3 is a waveform diagram 300 illustrating how distortion of early clock-signal edges is reduced relative to later edges. Data Drx(t) is identical to data D(t) of FIG. 2, and includes the same eye openings 205. Referring to clock edge 305, the reduced timing distortion due to CTLE 140 places the sample point within the respective eye to ensure a correct data sample.

In the example of FIG. 3 data signal Drx(t) is sampled on alternating rising and falling edges of clock signal EqClk(t). Ideally, this sampling produces samples equivalent to corresponding instantaneous values of continuous signal Drx(t). Depending on the type of sampler, a given sample can be taken using more than one clock edge. In another embodiment, for example, a sample uses a precharge-sense technique based on a pair of consecutive clock edges: a first clock edge starts an integration operation on received data and a second clock edge triggers a sampling operation. Many other methods and circuits for sampling data signals are well known to those of skill in the art.

Figure 4:
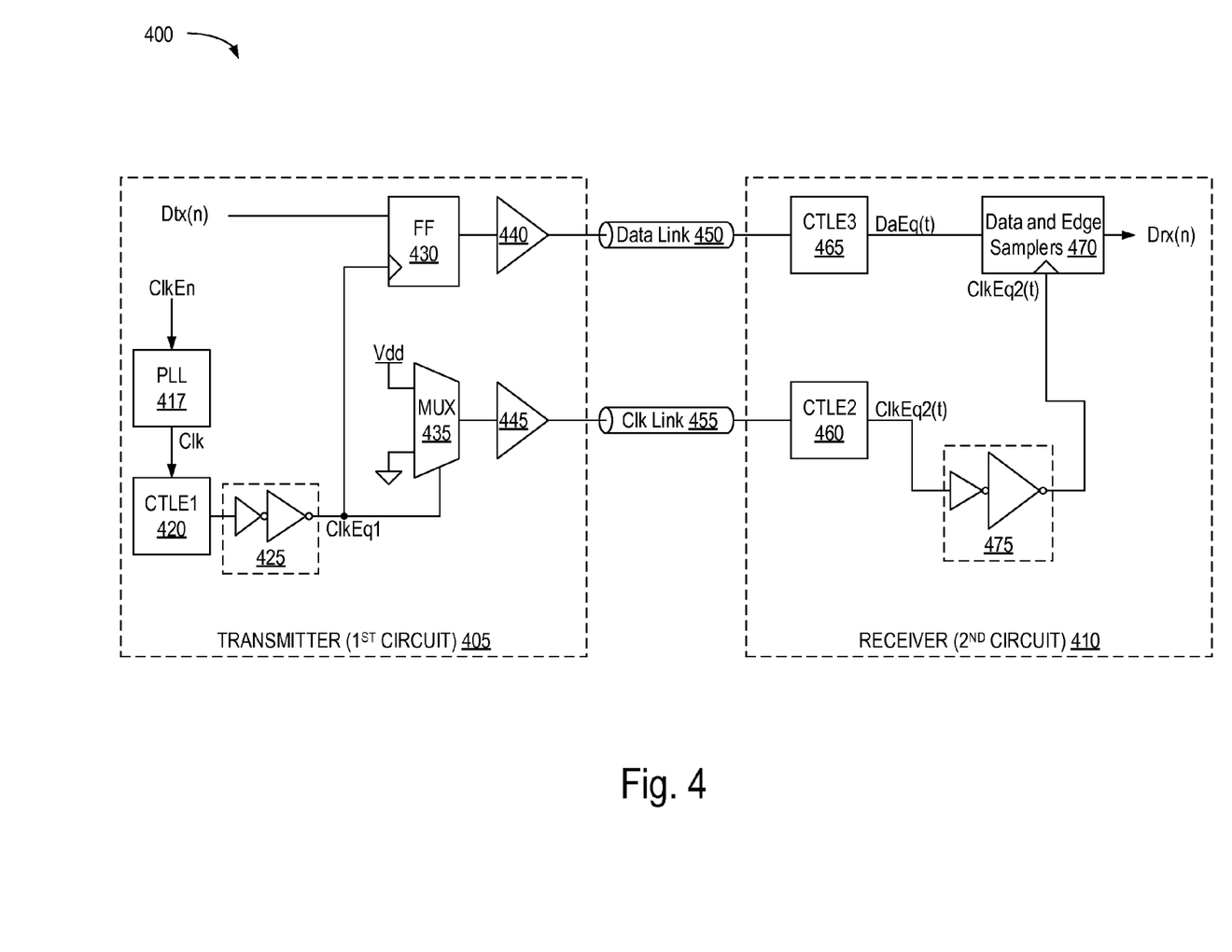
FIG. 4 depicts a communication system 400 in accordance with another embodiment.

FIG. 4 depicts a communication system 400 in accordance with another embodiment. Clock signals distributed within system 400 are equalized to reduce ISI that distorts early clock edges. System 400 includes first and second ICs 405 and 410, respectively a transmitter and a receiver, interconnected via a data link 412 and clock link 414. Transmitter 405 includes a phase-locked loop (PLL) 417 to develop a clock signal Clk, a first linear equalizer 420 to equalize the clock signal, a linear clock buffer 425, and a sequential storage element 430 (e.g. a flip-flop) that times a data signal Dtx(n) to an equalized clock signal ClkEq1 when a clock-enable signal ClkEn is asserted to allow PLL 417 to produce a clock signal Clk.

Transmitter 405 additionally includes a clock multiplexer 435 and a pair of buffers 440 and 445 to drive respective data and clock links 450 and 455. Buffers 440 and 445 may be CML buffers that use a low-voltage, differential signaling scheme. Receiver 410 includes two linear equalizers 460 and 465, data and edge samplers 470, and, in some embodiments, a linear clock buffer 475. System 400 can include equalization control circuitry as discussed above, but this circuitry is omitted here for ease of illustration.

Figure 5:
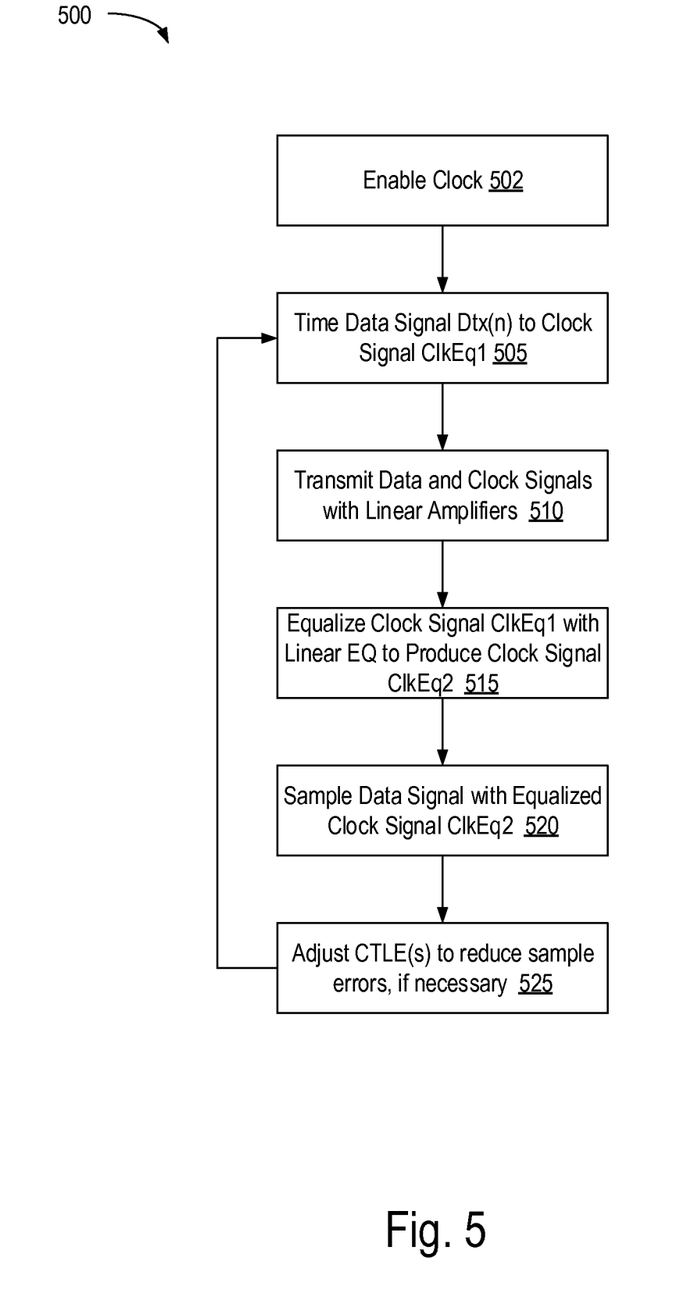
FIG. 5 is a flowchart 500 outlining a method of communicating between ICs 405 and 410 of FIG. 4 in accordance with one embodiment.

FIG. 5 is a flowchart 500 outlining a method of communicating between ICs 405 and 410 of FIG. 4 in accordance with one embodiment. Beginning with 502, some control circuitry (not shown) on transmitter 405 asserts clock-enable signal ClkEn to PLL 417. PLL 417 responds by presenting a clock signal Clk to equalizer 420, which in turn presents an equalized clock signal ClkEq1 to storage element 430 and multiplexer 435 via linear clock buffer 425. The clock destinations of system 400 are depicted as flip-flops and samplers, but other forms of sequential logic can also be used. Storage element 430 might be, for example, part of a parallel-to-serial converter. Linear equalizer 420 compensates for phase distortion imposed by linear clock buffer 425. The relative positions of buffer 425 and equalizer 420 are reversed in other embodiments. Non-linear clock buffers also suffer from ISI, and clock paths that include non-linear clock buffers are equalized in other embodiments.

Next, at 505, storage element 430 captures and conveys data signal Dtx(n) responsive to clock signal ClkEq1. Also responsive to this clock signal, multiplexer 435 couples the input of clock buffer 445 to alterative voltage levels, supply voltages ground and Vdd in this example. Buffer 445 responds by transmitting a version of clock signal ClkEq1 to receiver 410 while data buffer 440 transmits the synchronized data signal (510).

Receiver 410 equalizes the clock signal from transmitter 405 using linear equalizer 460 (515), which compensates for phase errors induced by both the combination of clock link 455 and clock buffer 475. In this example, receiver 410 equalizes the incoming data signal using linear equalizer 465 that compensates for phase distortion imposed by data link 450. Samplers 470 sample equalized data signal DaEq(t) on edges of equalized clock signal ClkEq2(t) to recover the original data as signal Drx(n) (520). Data edges are also sampled to provide feedback for clock phase adjustments, which are provided by conventional clock-recovery circuitry (not shown).

Error-detection circuitry, also not shown, can provide feedback with which to adjust one or more of equalizers 420, 460, and 465 (525) in the manner discussed above in connection with the embodiment of FIG. 1. These adjustments can be based on first-edge errors, or to achieve more general improvements. Equalizers 460 and 465, their settings, and their associated clock and data paths can in some embodiments be matched for improved data sampling.

Figure 6:
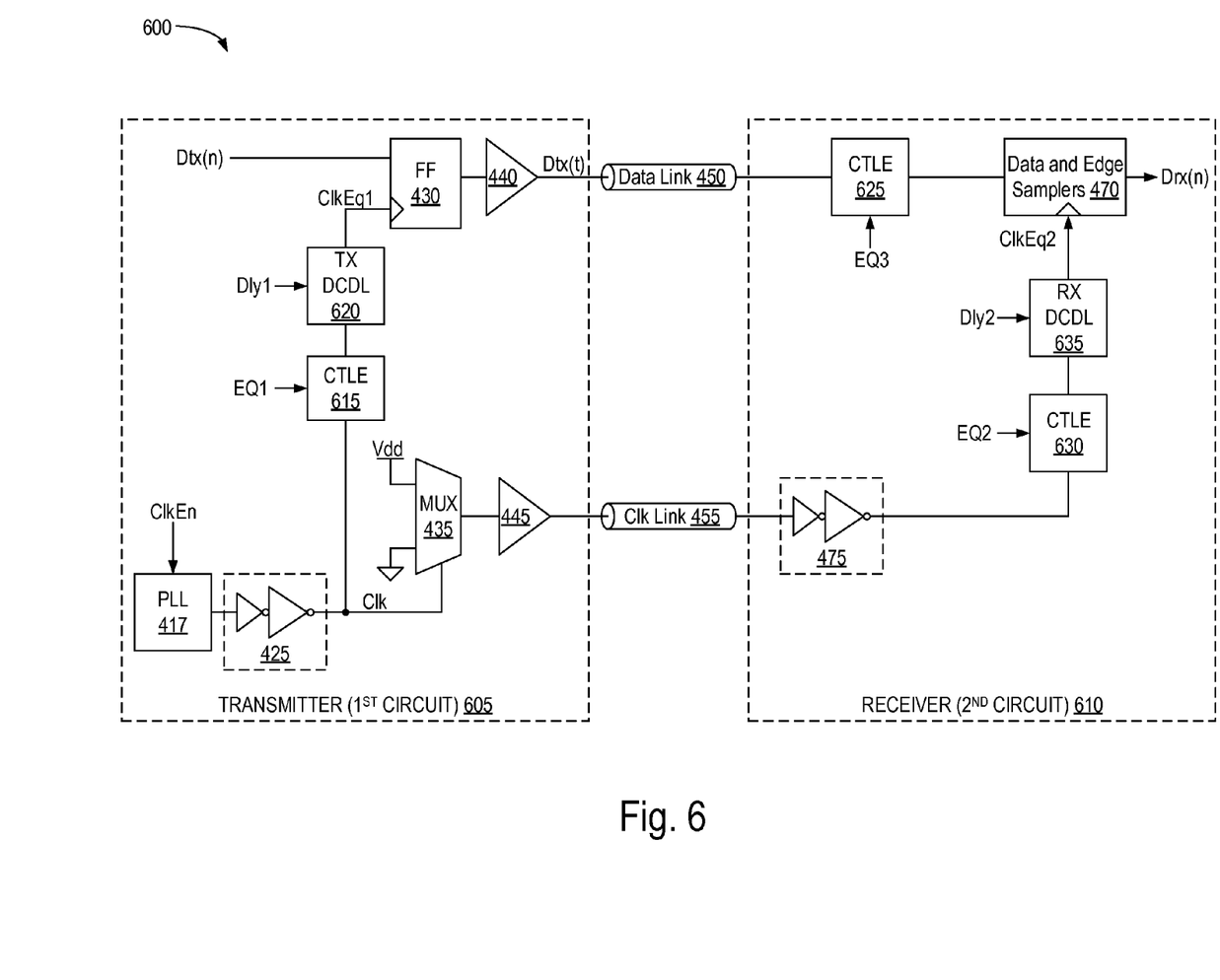
FIG. 6 depicts a communication system 600 in accordance with another embodiment, and includes a transmitter 605 and a receiver 610.

FIG. 6 depicts a communication system 600 in accordance with another embodiment, and includes a transmitter 605 and a receiver 610. System 600 is similar to system 400 of FIG. 4, with like-identified elements being the same or similar.

Transmitter 605 includes a linear equalizer 615 and a digitally controlled delay line (DCDL) 620 in the clock path between PLL 417 and storage element 430. Equalizer 615, a continuous-time linear equalizer in this example, receives a control signal EQ1 that can be used to change the frequency response of equalizer 615. Delay line 620 likewise receives a control signal Dly1, which can be used to adjust the phase of the clock signal applied to the clock input of element 430, and consequently the phase of the data signal Da(t) transmitted over link 450. Equalizer 615 thus can be set to compensate for any ISI generated from the combination of buffer 425 and delay-line 620. In a band-limited DCDL the amount of loss and distortion can vary as a function of delay, so the setting of equalizer 615 may require adjustment after the delay setting of DCDL 620 is established. Either or both of equalizer 615 and delay line 620 may be omitted or placed elsewhere in other embodiments. Other embodiments include a CTLE in the clock path common to the transmitter and receiver to compensate for ISI generated by e.g. buffer 425.

Receiver 610 includes a linear equalizer 625 for the data path, and a second linear equalizer 630 and a digitally controlled delay line 635 in the clock path. Equalizers 625 and 630 are both continuous-time linear equalizers in this example, and receive respective control signals EQ3 and EQ2 to change the frequency responses of the respective equalizers. Delay line 635 likewise receives a control signal Dly2, which can be used to adjust the phase of the clock signal applied to the clock input of samplers 470. Equalizer 630 in this case can be set to compensate for any ISI generated from the combination of buffer 475 and DCDL 635. Equalizer 625, equalizer 630, or delay line 635 can be omitted or placed elsewhere in other embodiments. Control signals EQ2 and EQ3 can be the same signals.

Digitally controlled delay lines are commonly implemented as a cascade of delay elements associated with some sort of multiplexer that selects between their outputs. The number of the delay elements an input signal traverses determines the total amount of delay through the delay line. In some examples the delay through individual delay elements can be altered by e.g. adjusting the load or drive current. Each delay element that makes up a delay line introduces some band-limiting distortion. To a first approximation, the amount of noise induced by a given delay line is therefore proportional to the number of selected delay elements employed to achieve the desired delay.

Figure 7:
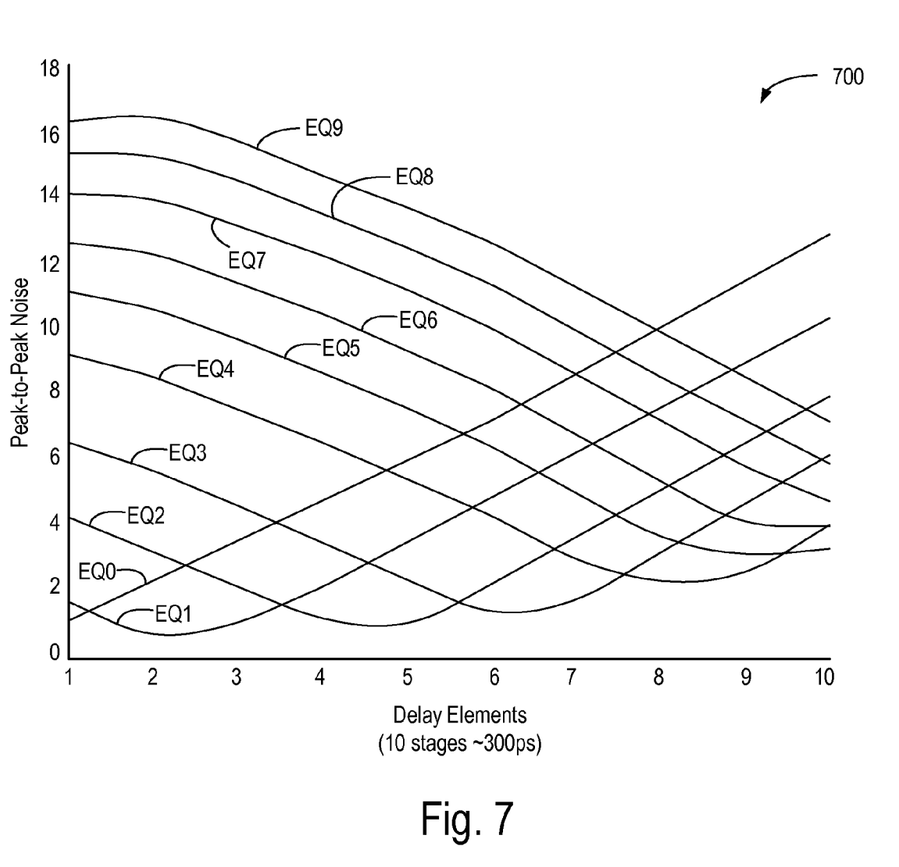
FIG. 7 is a graph 700 illustrating how the settings for delay line 635 and equalizer 630 interrelate in accordance with one embodiment.

FIG. 7 is a graph 700 illustrating how the settings for delay line 635 and equalizer 630 interrelate in accordance with one embodiment. This example assumes that delay line 635 includes ten delay stages, each of which provides 30 ps of delay, to provide a range of delays from 30-300 ps. The example additionally assumes that equalizer 630 supports ten equalization settings EQ[9:0]. The vertical axis of graph 700 represents the magnitude of the peak-to-peak jitter (primarily phase error) on clock signal EqClk of FIG. 6 when including first clock edges after a start from idle, and the horizontal axis represents the number of delay elements, or stages, employed to achieve a given delay.

As shown using line EQ0, which represents the case in which equalizer 630 provides the lowest level of equalization, the amount of peak-to-peak jitter increases fairly linearly with the number of delay stages. For the lowest level of delay, this equalization setting results in the least jitter. For higher levels of delay, however, other equalization settings produce less clock jitter, and are consequently preferred. With six or seven delay elements, which translates to either 180 ps or 210 ps of delay, equalization setting EQ3 produces the lowest level of clock jitter. Equalizer 630 can thus be tailored for whatever delay setting is used to align the data and clock signals at the receiver to provide minimum jitter when including first clock edges.

Figure 8:
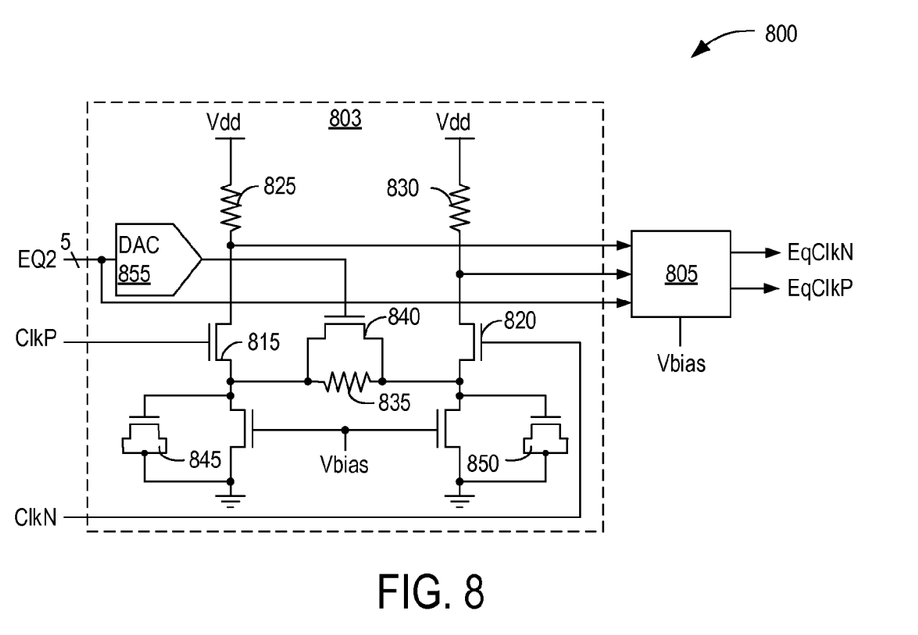
FIG. 8 schematically depicts a CTLE 800 that may be used in the foregoing embodiments.

FIG. 8 schematically depicts a CTLE 800 that may be used in the foregoing embodiments. Equalizer 800 includes two nearly identical stages 803 and 805, the second of which is depicted as a black box for ease of illustration. Other embodiments include more or fewer stages. Equalizer stage 803 includes a pair of differential input transistors 815 and 820 with respective loads 825 and 830. Source degeneration is provided by a resistor 835, a transistor 840, and a pair of capacitor-configured transistors 845 and 850. The capacitance provided by transistors 845 and 850 is in parallel with resistor 835 and transistor 840, so the net impedance between the sources of transistors 815 and 820 decreases with frequency. As a consequence, the gain of equalizer stage 803 increases with frequency. The resistance through transistor 840 can be adjusted to change the source-degeneration resistance, and thus to alter the extent to which the gain of equalizer stage 803 increases with frequency. In an alternative embodiment, source degeneration is provided by one or more floating metal-insulator-metal (MIM) capacitors connected in parallel with resistor 835. The MIM capacitors can be used instead of or in addition to transistors 845 and 850.

A DAC 855 converts a digital equalization control signal EQ2, five bits in this embodiment, to a gate voltage for transistor 840. The value of the equalization setting thus determines the resistance between the drains of transistors 815 and 820, and consequently the shape of the gain curve of equalizer stage 803. In general, the higher the resistance between the sources of transistors 815 and 820, the more extreme the gain curve of stage 803 over the frequency range of interest. In one embodiment, the output voltage from DAC 855 decreases as EQ2 increases from 000000 to 100000, remaining constant for higher counts. These maximum counts represent highest resistance between the sources of transistors 815 and 820, and consequently maximum equalization for stage 803. The output voltage from a similar DAC (not shown) in stage 805 remains high for counts up to 100000, decreasing count-by-count for higher values. Thus, the lowest equalization setting (Eq[5:0]=000000) represents the lowest source-degeneration resistance for both stages 803 and 805, while the highest equalization setting (Eq[5:0]=111111) represents the highest resistance. Other well-known types of CTLEs can be used in other embodiments.

Figure 9:
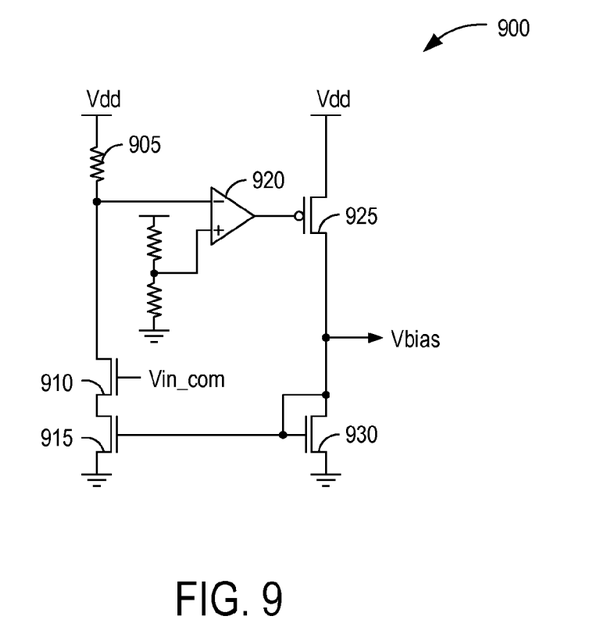
FIG. 9 schematically depicts a bias-voltage generator 900 for use with equalizer 800 of FIG. 8.

FIG. 9 schematically depicts a bias-voltage generator 900 for use with equalizer 800 of FIG. 8. A resistor 905 and transistors 910 and 915 form a half-circuit replica of equalizer stage 803, with the input common-mode voltage Vin_com of the clock signal applied to the gate of transistor 910. A feedback loop including an amplifier 920 and a pair of transistors 925 and 930 sets the voltage on the inverting (−) terminal of amplifier 920 equal to the voltage applied to the non-inverting (+) terminal. In an embodiment in which supply voltage Vdd is 1.2 volts, a resistor divider provides one-volt to the non-inverting terminal of amplifier 920. The resulting bias voltage Vbias to stages 803 and 805 establishes a one-volt common-mode voltage for those stages. In some embodiments, lower common-mode voltages are avoided to ensure that transistors 815 and 820 of FIG. 8 are always in saturation. The half circuit of FIG. 9 can be scaled down, by a factor of eight in one example, to save power. Other well-known types of bias-voltage generators can be used in other embodiments.

Figure 10:
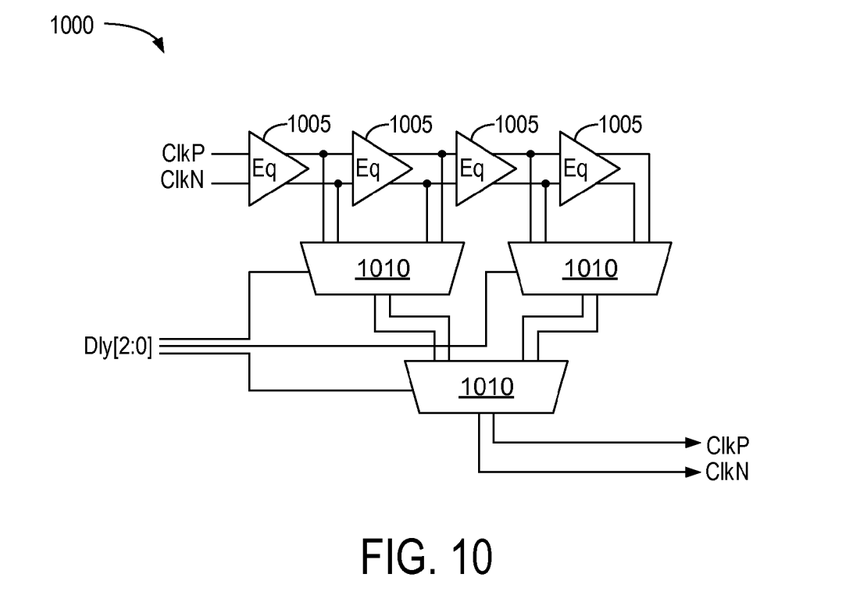
FIG. 10 depicts a digitally controlled delay line 1000 that doubles as an equalizer, and that can be used to both equalize and delay signals in accordance with one embodiment.

FIG. 10 depicts a digitally controlled delay line 1000 that doubles as an equalizer, and that can be used to both equalize and delay signals in accordance with one embodiment. As the effect of equalization is combined with the bandwidth-limited stage which produces the ISI, broader range/compliance and power efficiency can be achieved. Differential clock signal ClkP/ClkN is conveyed through a series of delay elements 1005, each of which is implemented using continuous-time linear equalizer, an example of which is detailed above in connection with FIGS. 8 and 9 as stage 803. A collection of multiplexers 1010, directed by a delay signals Dly[2:0], conveys the output of one of the delay elements as a delayed version of the incoming clock signal. The level of equalization imposed by delay elements 1005 can be adjusted separately, in groups, or collectively. Delay elements not in use can be disabled to save power.

Figure 11:
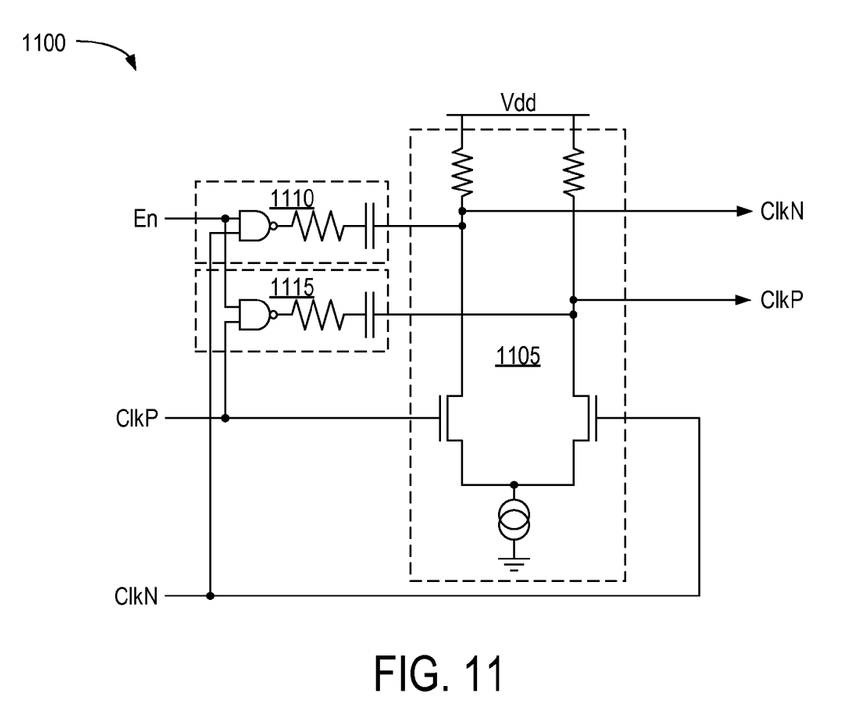
FIG. 11 depicts an embodiment of an equalizing driver 1100 in accordance with another embodiment.

FIG. 11 depicts an embodiment of an equalizing driver 1100 in accordance with another embodiment. In this example, driver 1100 includes a differential, current-mode driver 1105 and two filters 1110 and 1115. When enable signal En is asserted, the output from each of filters 1110 and 1115 exhibits a rapid rise or fall, depending upon the transition on the respective clock input node ClkP/ClkN, followed by an exponential decay. The filter outputs are summed with the output nodes of driver 1105. De-asserting enable signal En disables both filters. Control circuitry (not shown) can assert enable signal En for the duration of the first edge following a relatively long idle time. In other embodiments the filters can support different levels of filtering for different edges. For example, the capacitances applied for each filter can be different for the first and second edges following an idle time. Such an equalizing driver can be used on-chip, or as an equalizing off-chip buffer as described in earlier embodiments.

Figure 12:
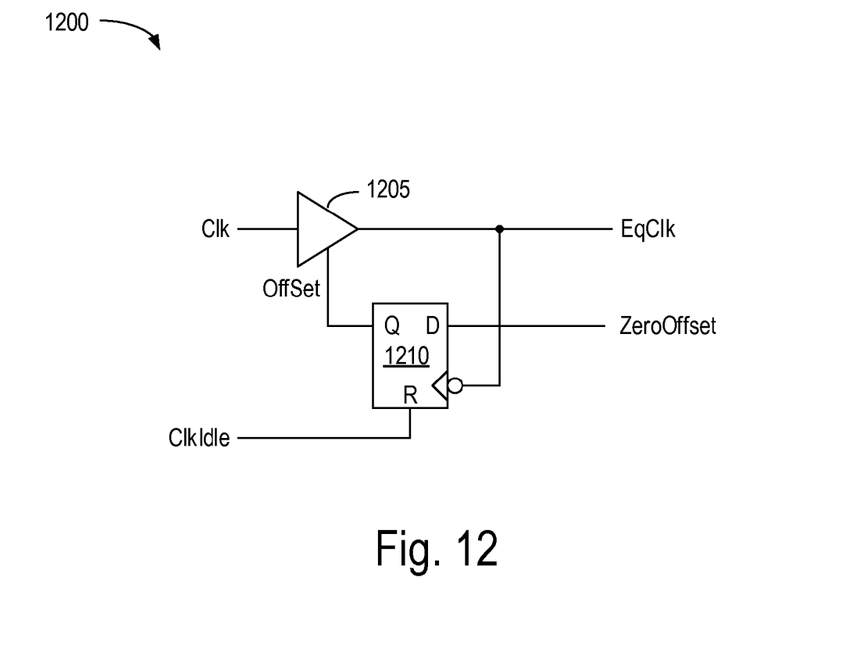
FIG. 12 depicts a clock equalizer 1200 in accordance with another embodiment.

FIG. 12 depicts a clock equalizer 1200 in accordance with another embodiment. Equalizer 1200 includes a clock buffer 1205 with an adjustable switching level that can be offset from its normal operational value responsive to a signal OffSet from a sequential storage element 1210. The offset is applied during the first edge or edges following periods during which clock signal Clk is idle to compensate for the first-edge distortion noted previously.

Figure 13:
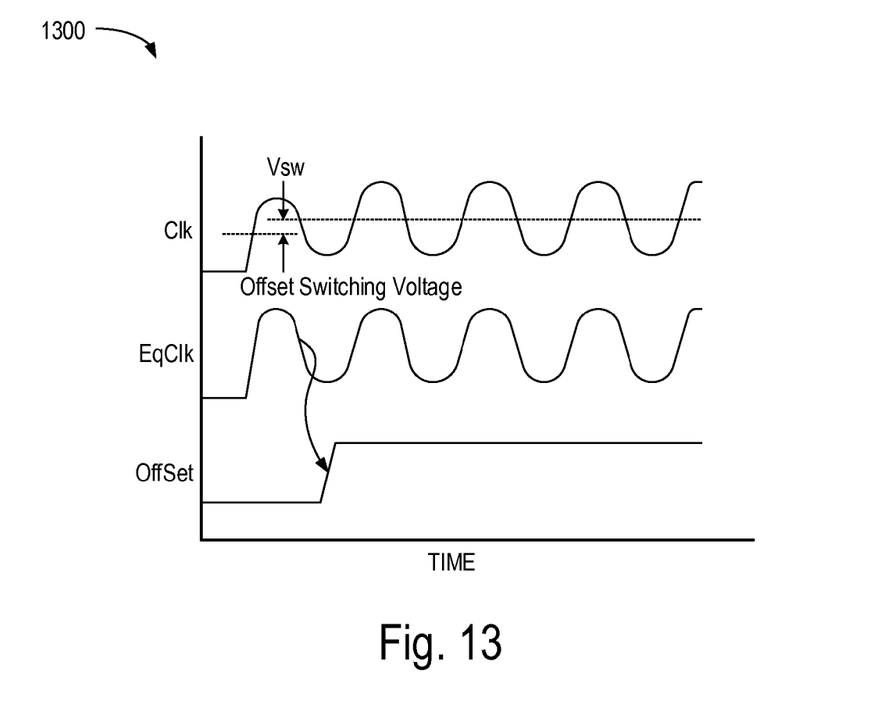
FIG. 13 is a waveform diagram illustrating the operation of equalizer 1200 of FIG. 12.

FIG. 13 is a waveform diagram illustrating the operation of equalizer 1200 of FIG. 12. When clock signal Clk is idle, signal ClkIdle is asserted and storage element 1210 presents a low signal OffSet to clock buffer 1205. As a consequence, buffer 1205 exhibits a switching voltage that is low relative to the normal operational switching voltage Vsw. Storage element 1210 responds to the first falling edge of the equalized clock signal EqClk by applying a high signal OffSet to clock buffer 1205, which removes the offset so that buffer 1215 exhibits switching voltage Vsw. The switching voltage then remains at voltage Vsw until clock signal Clk is idle and signal ClkIdle is consequently asserted.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments are also envisioned. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. For U.S. applications, only those claims specifically reciting "means for" or "step for" should be construed in the manner required under the sixth paragraph of 35 U.S.C. Section 112.

What is claimed is:
1. An integrated circuit comprising:
   a data sampler having a data input node, a data output node, and a clock node;
   a data path extending to the data input node;
   a clock path extending from a clock source to the clock node and including a continuous-time equalizer with an equalization control port; and
   equalization control circuitry coupled between the data output node and the equalization control port.
2. The integrated circuit of claim 1, wherein the equalizer is a linear equalizer.

3. The integrated circuit or claim 1, wherein the equalization control port receives an offset signal that adjusts a voltage offset of the equalizer.

4. The integrated circuit of claim 3, wherein the control circuitry applies the offset signal for a first edge of a clock signal in the clock path to produce an equalized clock signal and removes the offset signal responsive to an edge of the equalized clock signal.

5. The integrated circuit of claim 1, wherein the clock path further includes a linear clock buffer.

6. The integrated circuit of claim 5, wherein the clock buffer is a CML buffer.

7. The integrated circuit of claim 1, wherein the equalizer is one of a plurality of linear equalizers selectively included in the clock path, wherein a number of linear equalizers selectively included in the clock path defines delay through the clock path.

8. The integrated circuit of claim 7, further comprising a multiplexer in the clock path to select an output of one of the linear equalizers.

9. A receiver comprising:
  a clock path having a continuous-time equalizer to alter high-frequency components relative to low-frequency components of a clock signal expressed as a series of clock edges following a null period, the clock edges including an initial clock edge followed by subsequent clock edges; and
  a data sampler having a data input node to receive initial and subsequent data symbols and a clock node to receive the initial and subsequent clock edges, the data sampler to sample at least a subset of the initial and subsequent data symbols responsive to the subsequent clock edges.

10. The receiver of claim 9, the data sampler to sample the initial symbol using the initial clock edge.

11. The receiver of claim 9, wherein the equalizer is a linear equalizer.

12. The receiver of claim 9, wherein the clock path further includes a clock buffer.

13. The receiver of claim 9, further comprising feedback circuitry coupled to the equalizer to adjust a phase of the clock signal responsive to the sampled data symbols.

14. A method of timing receipt of a data signal, the method comprising:
  timing the data signal to a clock signal using a first sequential storage element;
  equalizing the clock signal, using an equalizer, to emphasize lower-frequency components of the clock signal relative to higher-frequency components of the clock signal;
  transmitting the data and the equalized clock signals to a second sequential storage element;
  sampling the data signal, using the second sequential storage element, on edges of the equalized clock signal; and
  adjusting the equalizing of the clock signal responsive to errors in the sampled data signal.

15. The method of claim 14, further comprising equalizing the data signal, using a second equalizer, before sampling the data signal.

16. The method of claim 14, further comprising adjusting the equalizing of the clock signal and the equalizing of the data signal responsive to errors in the sampled data signal.

* * * * *